United States Patent [19]
Chew et al.

[11] Patent Number: 6,084,494
[45] Date of Patent: Jul. 4, 2000

[54] SHUNTABLE MAGNETIC MASK SUPPORT APPARATUS

[75] Inventors: Geary L. Chew, Foster City; Matthew K. Schwiebert, Cupertino; Ayn R. Lavagnino, Palo Alto; Andy H. Uchida, Mountain View, all of Calif.

[73] Assignee: Hewlett-Packard Company, Palo Alto, Calif.

[21] Appl. No.: 08/787,615

[22] Filed: Jan. 23, 1997

[51] Int. Cl.[7] ........................................ H01F 7/20
[52] U.S. Cl. ................................. 335/283; 269/8
[58] Field of Search ................... 335/285, 286, 335/287, 288; 269/8

[56] References Cited

U.S. PATENT DOCUMENTS

| | | | |
|---|---|---|---|
| 5,147,828 | 9/1992 | Ebbing et al. | 437/250 |
| 5,266,914 | 11/1993 | Dickson et al. | 335/288 |
| 5,474,614 | 12/1995 | Robbins | 269/8 |

*Primary Examiner*—Lincoln Donovan

[57] ABSTRACT

A mask support device including two communicating elements, a first element having ferromagnetic shunts, and a second element containing permanent magnets, and wherein the elements are rotatable about a central axis and assume fixed positions in the rotation. The mask support device in one position attracts a ferromagnetic metal mask. In a second position, owing to the shunt redirecting the magnetic field, releases the metal mask.

10 Claims, 9 Drawing Sheets

SHUNTABLE MAGNETIC MASK SUPPORT APPARATUS

BACKGROUND OF THE INVENTION

1. Field of the Invention

This invention relates to supporting frames, in particular, removable supporting frames for thin ferromagnetic masks such as are useful in manufacturing processes.

2. Description of Related Art

Metal masks and stencils useful in many manufacturing processes typically have frames by which the mask or stencil is handled and which serves to keep the mask taut and crease free and storage devices to keep the mask flat and protected. Mask or stencil and frame typically expand at different rates during heating due to differences in coefficient of thermal expansion and/or differences in thermal mass. Some processes, most particularly that disclosed in U.S. Pat. No. 5,539,153 assigned to Hewlett-Packard Company provide for heating a mask, hereinafter referred to as Hewlett-Packard CPD process or CPD (for "contained paste deposition"). A frameless mask is desirable because during heating or cooling the mismatched expansion of rigid frames damage or destroy the mask. However, the thin metal mask must be kept flat and handled properly in order for the manufacturing process to be commercially feasible. A substitute for a rigid frame is necessary. Many difficulties are presented by rigid frames and alternative support devices or securing methods, such as vacuum. In applications where the mask is heated, a rigidly attached frame causes large tensile stresses to build up in the mask when the temperature of the mask/frame assembly changes. These stresses damage the mask.

Protruding mechanical fasteners can dent the mask when the mask is repeatedly loaded and unloaded from the frame or ring. Protruding fasteners also require alignment with holes in the mask during loading. Fasteners entrap liquids and cleaning solutions during cleaning. Thus, protruding fasteners reduce some of the benefit of a reusable mask. A manufacturing process solution is needed that maximizes the economy of a reusable mask.

Freestanding masks are also problematic as far as current solutions are concerned. The lack of a support ring causes the mask to bend out of plane during any handling step as well as shipping, cleaning and measuring of the mask. These bending stresses cause plastic deformations which permanently damage the mask.

Mask attachment by vacuum solves some problems but creates others. Vacuum attach to a mask support requires that the support be attached to a vacuum source. The requirement of a vacuum source renders vacuum attach impractical for remote manipulations such as shipping and storage. Moreover, vacuum during a cleaning process may suck water and cleaning agents into vacuum lines which can damage vacuum equipment, adding cost to the process.

Finally, sliding parts can create particles which cause defects in processes such as integrated circuit fabrication.

What is needed is a mask support that introduces little or no tensile stress, and that eliminates out-of-plane bending. What is also needed is a mask support that is easy to attach and detach, without protruding features or fasteners, and without vacuum or sliding parts. Further desirable is the elimination of drag-out of liquids during cleaning; such elimination ensures that this excess moisture does not adversely affect subsequent processes or mask.

SUMMARY OF THE INVENTION

The invention taught herein provides a releasable, non-sliding, magnetic mask holder and support for a substantially freestanding ferromagnetic mask. The invention provides a support apparatus enabling the use of a free standing (frame-less) ferromagnetic mask by supporting, protecting and planarizing the mask during manipulations such as cleaning, transfer and storage. The inventive support device facilitates re-use of metal masks.

The support device includes two couplable elements, one containing magnets and one containing shunts. The metal mask will either be held flat against the two coupled elements or released, depending on the position on the magnet and shunt, that is to say, whether the magnetic force is free to act on the mask and hold it, or not. If the shunt is aligned with the magnet, the mask is released from the support device. If the shunt is not aligned with the magnet, the mask is held securely by the support assembly.

The invention may be understood by referring to the detailed description that follows, and by reading the detailed description in conjunction with the drawings. The detailed description sets forth a preferred embodiment and is not intended to limit the claims but rather to serve as only a particular example of the claimed invention.

BRIEF DESCRIPTION OF THE DRAWINGS

FIG. 1, 1A and 1B inclusive, depicts, in an uncoupled configuration, the shunt-support ring and the mask ring of the mask holder according to the present invention.

FIG. 1, 1C and 1D, inclusive, depicts an enlarged subsection of the shunt-support ring coupled with the mask ring in the region identified as 12 in FIG. 1A and 14 in FIG 1B.

FIG. 2, 2A through 2C inclusive, schematically depicts a side view of the magnetic spoke assembly in the "on" (mask attract) position, rolling between positions, and in the "off" (mask release or detach) position.

DETAILED DESCRIPTION

Figure 1A:
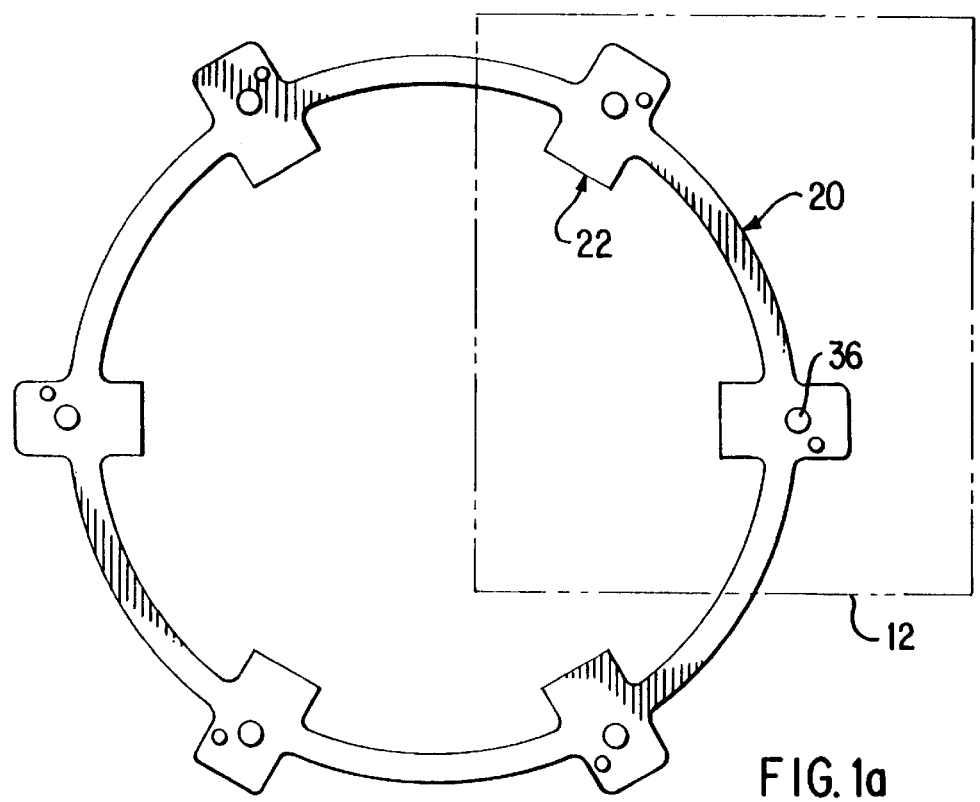
Figure 1B:
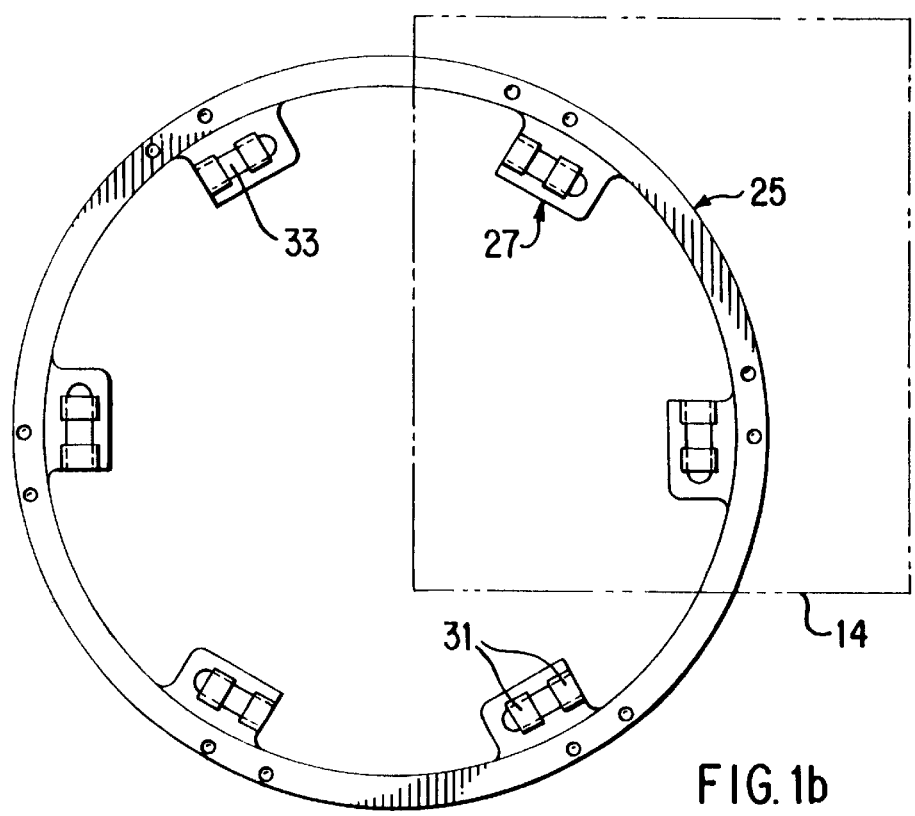

FIG. 1, A through D inclusive, depicts the non-sliding shuntable magnetic mask holder taught herein. The mask support assembly 10 includes two couplable elements: a shunt containing element 20 and a magnet containing element 25. In the preferred embodiment, the two elements are ring shaped because it is a shape commonly used in wafer bumping processes and such processes can easily employ the invention to a manufacturing advantage. The shunt containing element 20 has one or more ferromagnetic shunts 22. The magnet containing element 25 has one or more magnets. Magnets in the preferred embodiment are contained in non-magnetic spokes 27 and each spoke 27 is further characterized by fixably containing a pair of ferromagnetic pole pieces 31 and a permanent magnet 33, arranged so that there is one piece at each pole of the permanent magnet 33. The shunt containing and magnet containing elements 20, 25 each being a compatible size with respect to the other to facilitate coupling; and the spokes 27 configured and alignably coupled so that the ferromagnetic shunts 22 of the shunt containing element 20 overlap the ferromagnetic pole pieces 31 of the magnet containing elements at the same point of relative rotation of the two elements 20, 25.

Figure 2C:
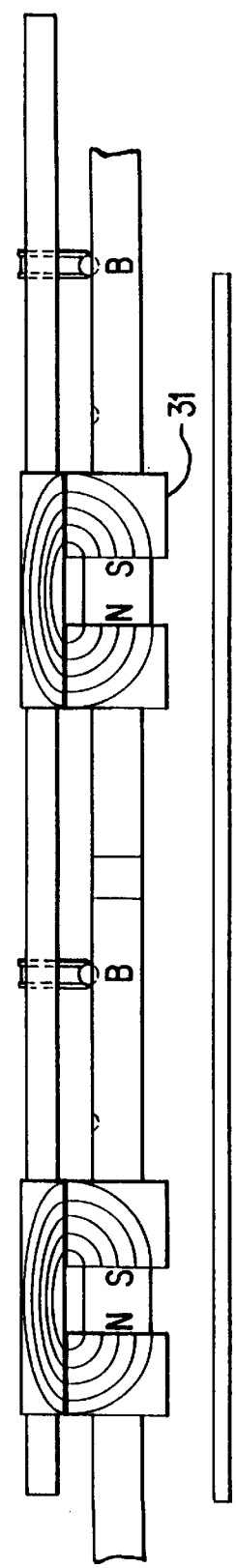
Figure 3:
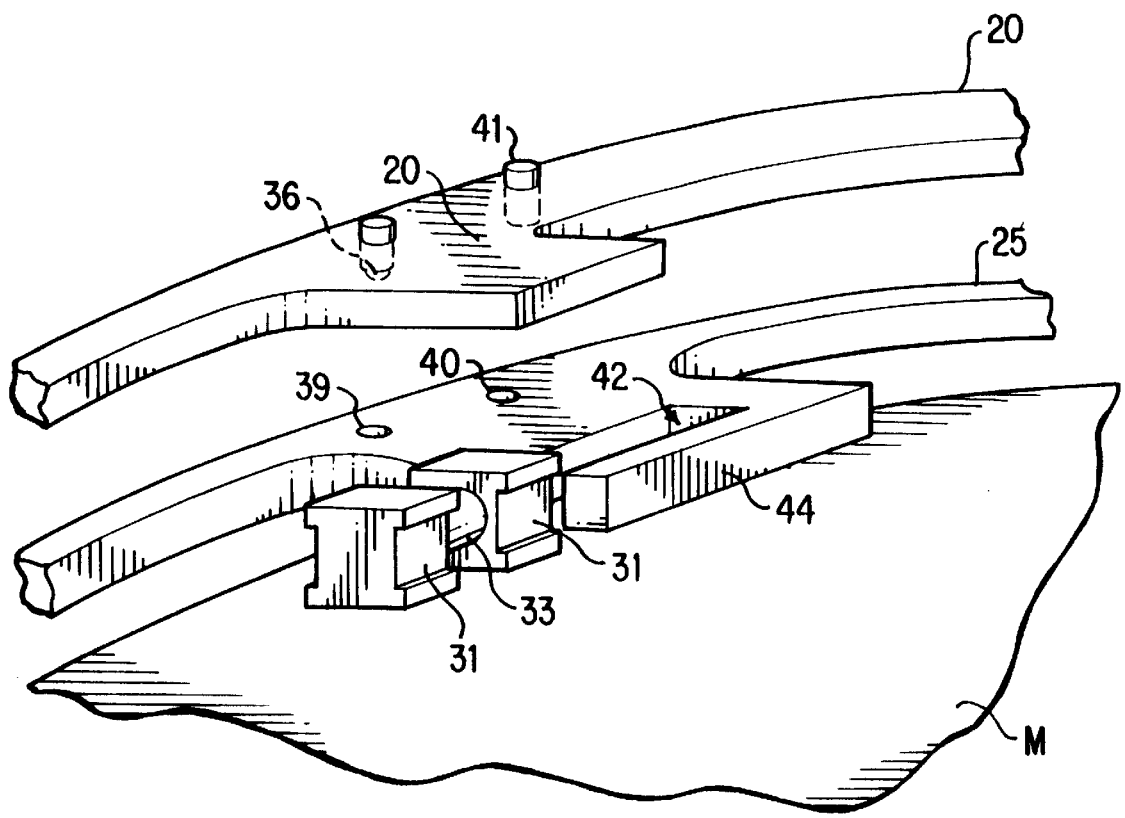
FIG. 3 schematically illustrates an exploded cross-section of the shunt-support ring and the mask ring, including pole pieces and magnet and the U shaped spoke of the preferred embodiment taught in the present invention.

The spoke 27 in the magnet containing element 25 is schematically detailed in FIG. 3. A spoke 27 of the magnet containing element 25 is typically made of a non-ferromagnetic material, and further includes a pair of ferromagnetic pole pieces 31 attached to the pole ends of a permanent magnet 33. FIG. 1, 1C and D inclusive, illustrate the shunt containing element 20 alignedly atop the magnet containing element 25. FIG. 1C depicts the configuration of the mask holder 10 in the mask detach or "off" position 12 as well as the mask attract or "on" position 14. In 1C, the ferromagnetic shunts 22 of the shunt containing element 20 are alignable with the spokes 27 of the magnet containing element 25 along a radial axis, such that the shunts 22 simultaneously make contact with the north and south pole pieces 31 fixed in the spoke 27, thereby effectively shunting the magnet. This aligned configuration causes a redirection of the magnetic flux F of the permanent magnet 33 through the shunt 22 and away from the mask. Thus, the shunted 12 position constitutes the mask detach or "off" position of the mask holder 10. The re-direction of the magnetic flux results in the release of the mask M from the mask support assembly 10 (see FIG. 2C).

Figure 1C:
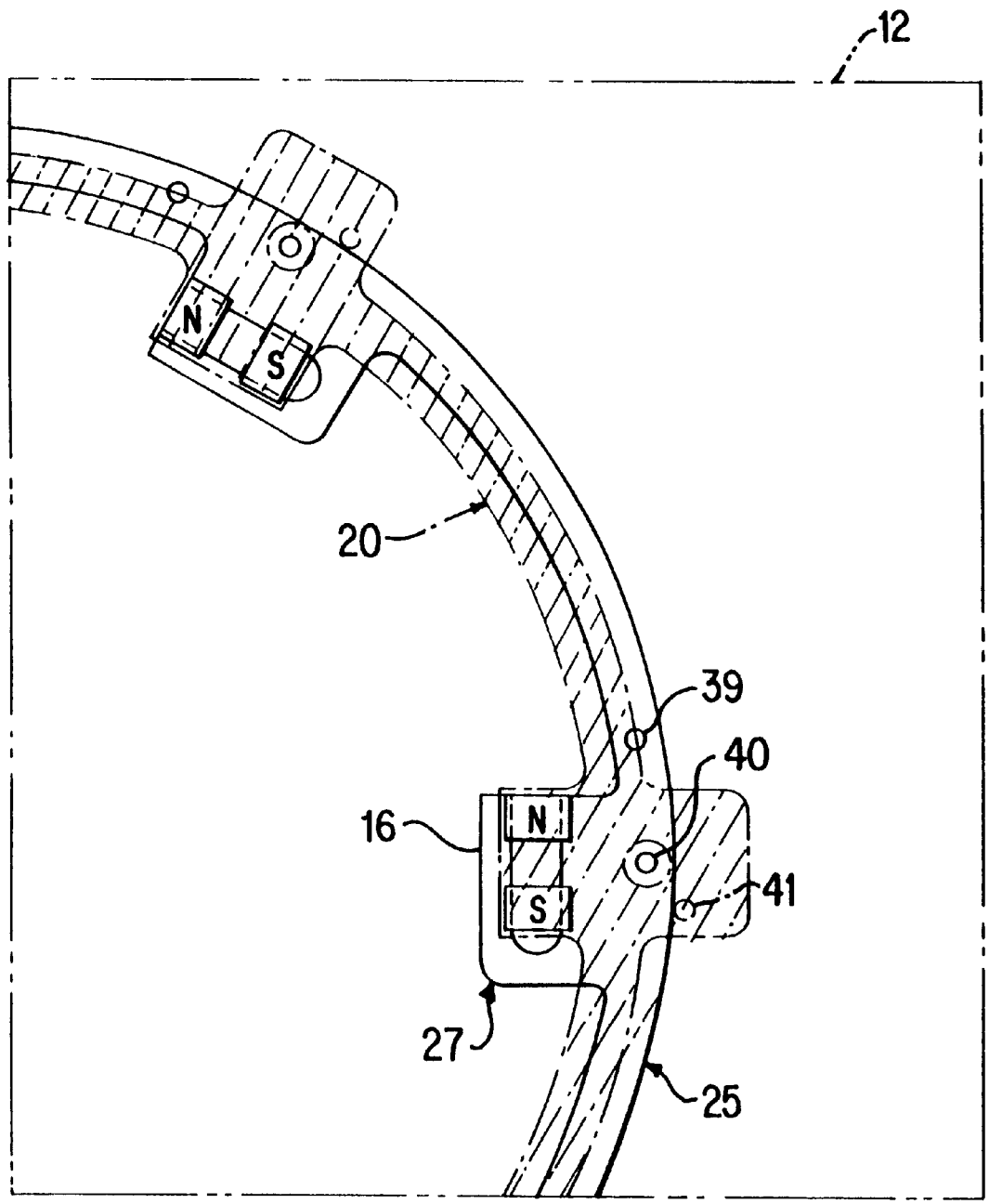
Figure 1D:
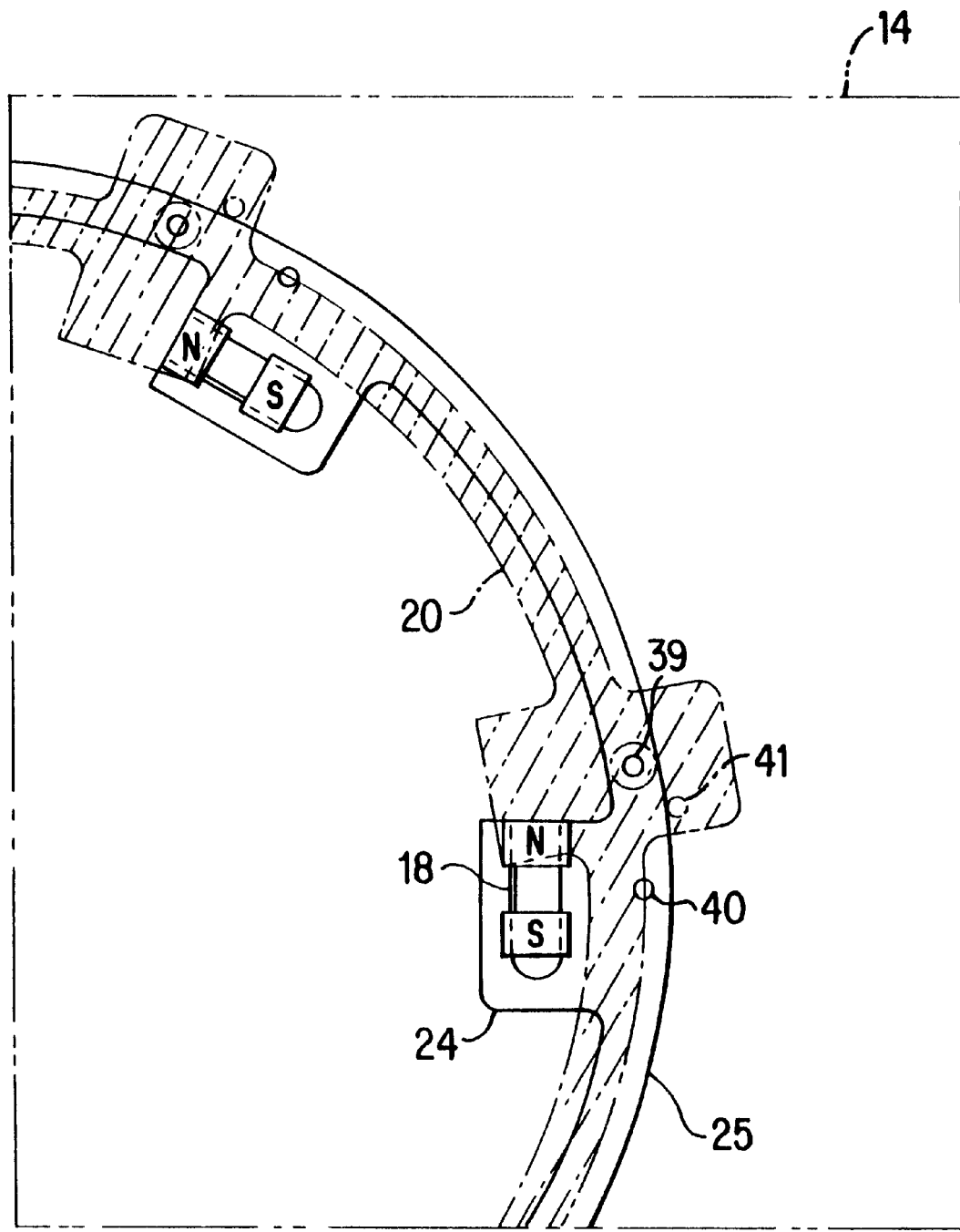
Figure 2A:
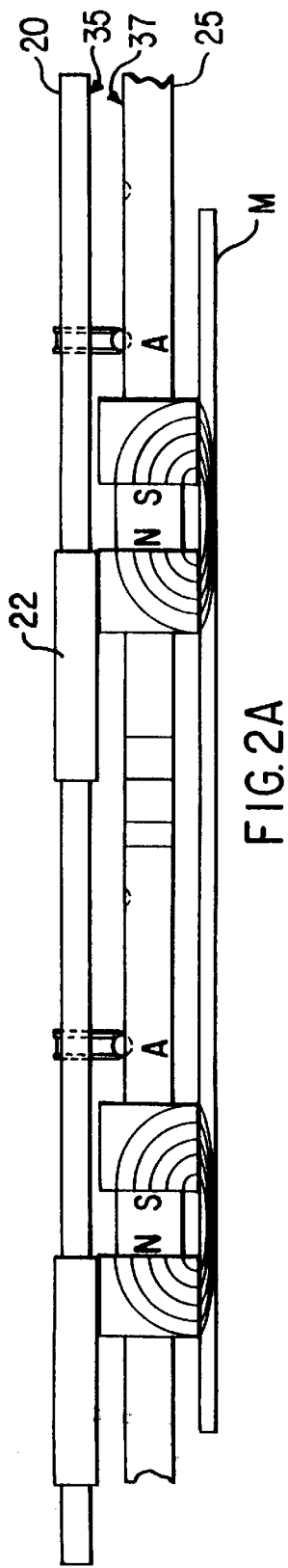

As depicted in FIGS. 1A and 2A, the shunt containing element 20 is rotated so that the shunts 22 are moved sufficiently beyond the pole pieces 31 and so that the magnetic field F is not redirected by the shunt 22 and the flux flows sufficient to attract the mask to the mask support assembly 10.

Figure 2B:
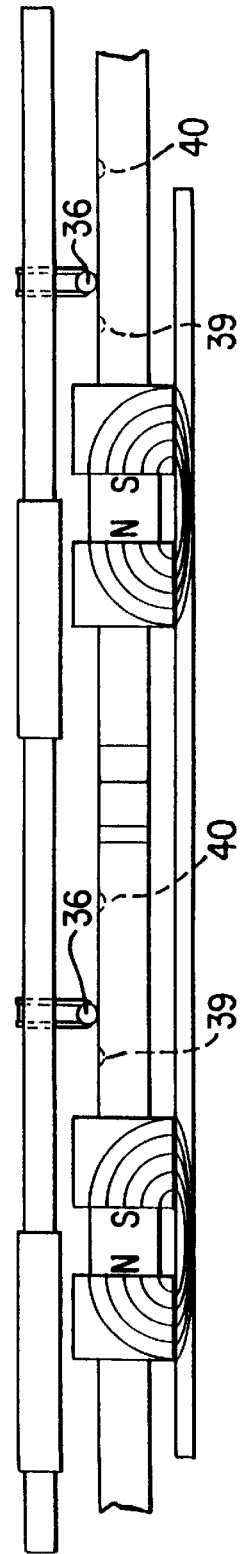

Operation of the mask holder 10 is effected through aligned rotation of the two elements 20, 25 about a central axis. As illustrated in FIG. 2, the mask is attached to the support assembly by placing the support assembly in proximity to the mask and by rotating the shunt containing element relative to the magnet containing element so as to move the magnets out of alignment with the corresponding shunts. First, the support assembly is placed next to the mask, such that the pole pieces 31 contact the mask M. Then, the shunt containing element 22 is rotated relative to the magnet containing element, such that the magnets 33 are no longer shunted and their flux is used to attract the metal mask and retain it against the support assembly. The rolling action of the rolling member 36 out of the detents 39, 40 lifts the assembly slightly so there is no sliding contact of the shunt containing element against the pole pieces 31.

In the preferred embodiment, the shunt containing element 20 moves into contact with the magnet containing element 25 by means of rolling members 36, typically balls or rollers, positioned at predetermined intervals along the mask-facing surface 35 of the shunt containing element 20. The preferred embodiment provides one rolling member 36 for each of the six spoke/shunt 27, 22 pairs. In the shunt containing element facing surface 37 of the magnet containing element 25, there are at least two receiving regions or detents per rolling member: a first detent 39 corresponding to the alignment of spokes and shunts in the mask attract or "on" position (see FIG. 2A), and a second detent 40 corresponding to the alignment of spokes and shunts in the mask release or "off" position (see FIG. 2C).

The magnet containing element 25 of the preferred embodiment is made of aluminum (approximately 3.5 mm thick) with six equidistant spokes. The non-magnetic spokes 27 may number as few as three and may be any number suitable for the operation of mask holding and support. The spokes may be made of any non-ferromagnetic material.

The non-magnetic spoke 27 of the preferred embodiment (illustrated in FIG. 3) fixes the magnet 33 and ferromagnetic pole pieces 31 through insertion into a U shaped or three sided rectangular opening 42 in the spoke 27 and subsequent application of epoxy (not shown). The epoxy protects the magnet 33 from chipping and other physical damage, as well as from possible chemical exposure. The three sided rectangular opening 42 is bounded on either lateral border by two non-ferromagnetic sections 44; the sections 44 are approximately 7 mm in width.

In the preferred embodiment, the permanent magnet 33 is nickel-plated neodymium iron boron. The short aspect ratio permitted by the rare earth magnets such as neodymium iron boron is useful for the dimensions of the spoke 27 in the preferred embodiment, although any permanent magnet may be employed, provided the magnet is capable of withstanding manufacturing conditions. The pole pieces 31 in the preferred embodiment are nickel plated iron or nickel-plated low carbon steel. Other materials will be apparent to the person familiar with materials science. For the mask typically used in association with the CPD process described in U.S. Pat. No. 5,539,153, diameters of the magnet containing and shunt containing elements range from 7 inches to 14 inches, depending on the size of the wafer being bumped. Mask thickness may range from 0.002 inches to 0.012 inches, and the magnets and other features of the invention taught herein will be selected so as to ensure the firm attach of the particular mask or range of masks to the support assembly during processing.

The selection of which element exhibits rolling members or detents is entirely a matter of manufacturing election. The shunt containing element could have detents, or a combination of detents and rolling members, as could the magnet containing element. All functionally equivalent combinations are considered to be taught herein as alternate embodiments of the invention.

Figure 6:
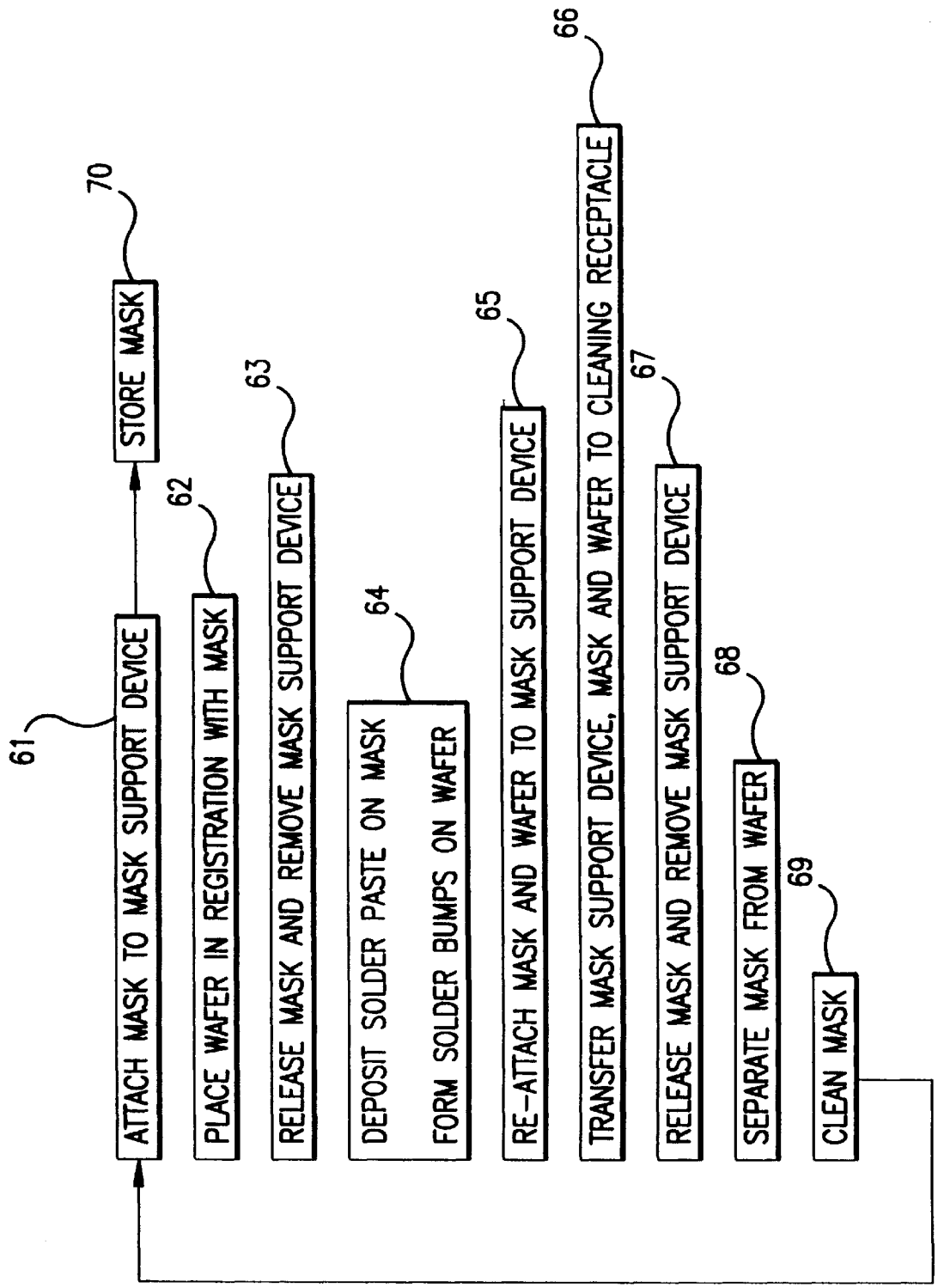
FIG. 6 relates to the method taught by the invention.

The person of average skill in the art will understand the utility and various means for incorporating the inventive mask support device into an automated the mask handling and manipulation system for some or all of a given process. Moreover, a person knowledgeable of the requirements of the CPD or similar process can readily perceive the applications of the mask support assembly to the mask handling steps as well as the role of mask support device in the solder bump formation process, including alignment, solder paste application, bump formation, inspection and cleaning of the reusable mask, and other steps required for the entire CPD or similar process as depicted in FIG. 6. Most especially, the mask support assembly permits the steps of attaching a mask to the mask support device 61; placing a wafer in registration with the mask 62 on the side of the mask opposite to the mask supporting device; then releasing the mask and removing the mask support device 63. Solder paste can be applied to the mask surface and then the paste, the mask and the wafer can undergo baking so as to enable the solder paste to form solder balls 64. After baking, the mask support assembly may be reattached 65 and used to transfer the mask and wafer (which generally adheres to the mask after baking) to a cleaning receptacle 66 and releasing the mask support device from the mask 66, whereupon the wafer can be separated from the mask 68, and the mask cleaned 69. After cleaning, the mask support device may be reattached to the mask in order that the mask may be re-used immediately 61 or the mask may be transferred to a storage container 70.

Figure 4A:
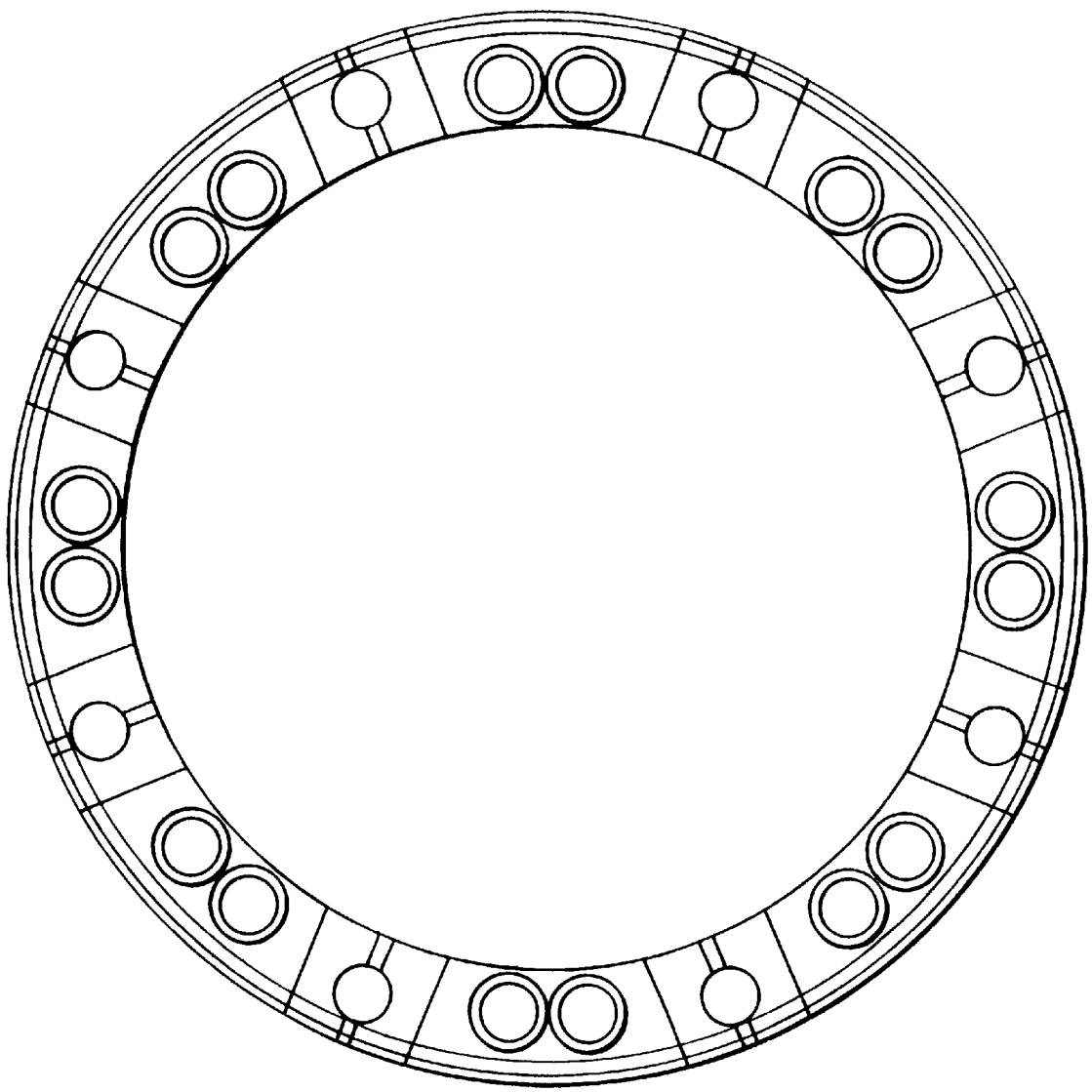
FIG. 4 relates to an application of the invention.
Figure 4B:
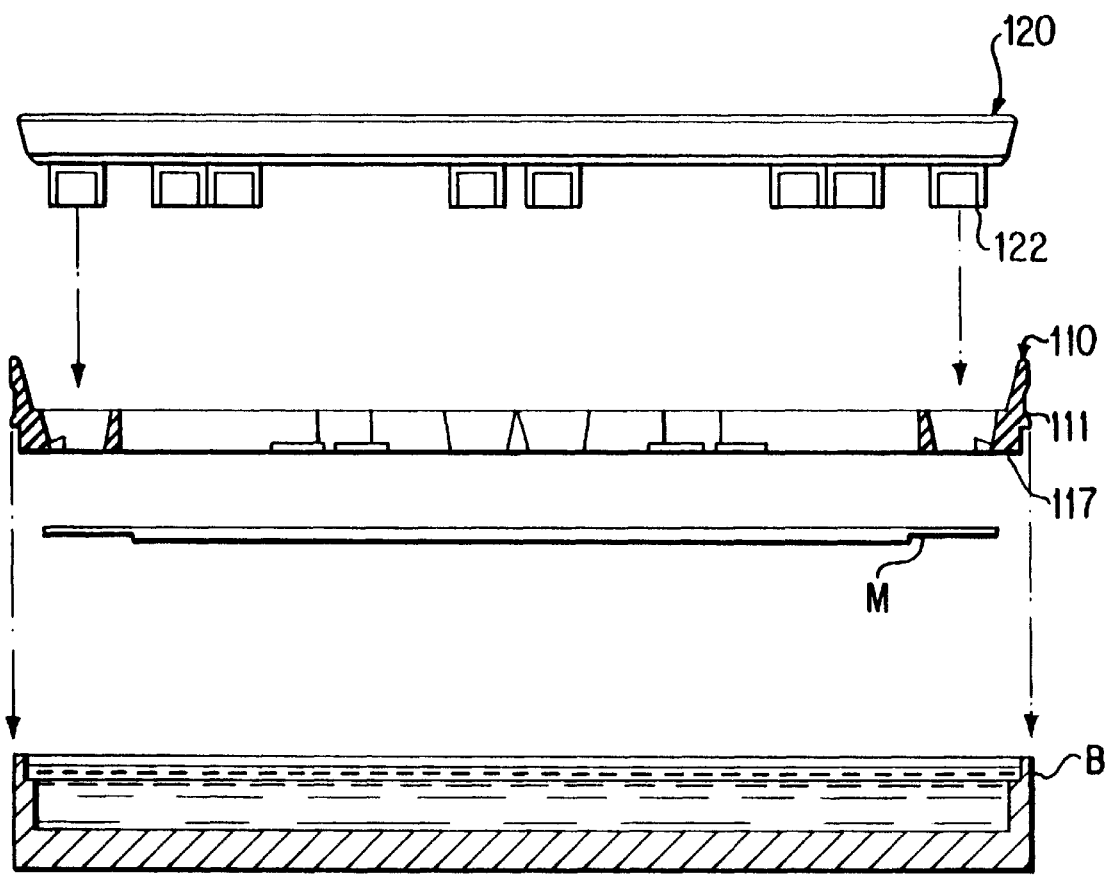
Figure 4C:
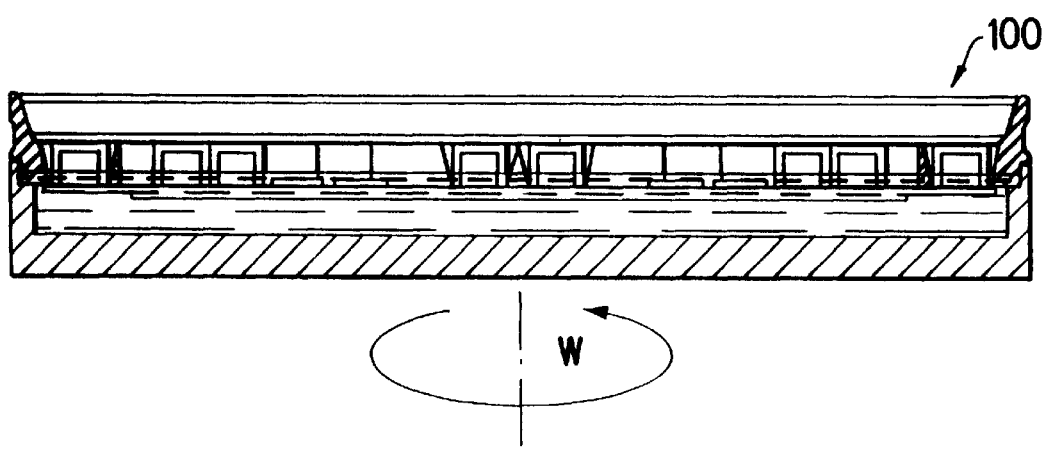
Figure 5:
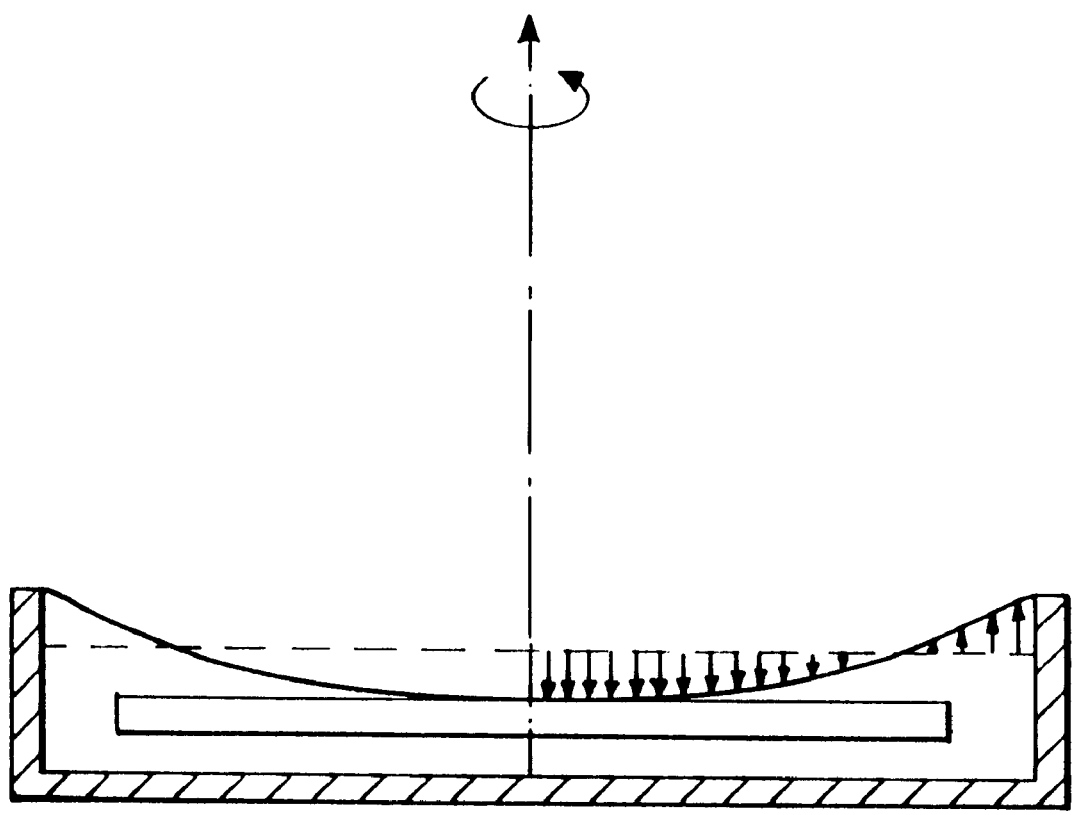
FIG. 5 relates to an application of the invention.

Use of the mask support assembly in a cleaning and transfer application in wafer bumping process such as CPD is set forth below and depicted in FIGS. 4 and 5. Handling the mask without damage dictates keeping the mask stored in a flat storage container shaped to accommodate the mask, e.g. a round storage container for a round mask. Transferring the mask from the storage container is accomplished by placing a ring with holes (hole ring 110 with receiving holes 112) over the mask M while the mask is in the storage container. Centering is readily accomplished in a round storage container. Next, a ring containing magnetic cups or protrusions (magnet ring 120) arranged so as to be insertable into the holes 112 of the hole ring 110 is placed on top of the hole ring 110 and the magnetic cups 122 inserted into the receiving holes 112. At this point, the mask is attracted to and held flush against the hole ring 110 by means of the magnets in the magnet ring 120. The entire assembly can now be removed from the storage container and placed in a process station.

Solder bump formation typically results in the wafer adhereing to the mask due to water-soluble flux residues and other baked on material. Removal of the wafer from the mask can be accomplished hydrostatically. Cleaning of a reusable mask is facilitated by the mask support device taught herein. To remove the mask from the wafer, the hole ring 110 and magnet ring 120 are reattached as described above. Next, the assembly is placed in an empty bucket or reservoir B. Water is introduced from the top of the fixture and allowed to flow over the surface of the mask M and down into the bucket or reservoir B by means of the water flow channels 114 in the hole ring 110. An O ring seal 111 around the base of the hole ring 110 permits the entire assembly 100 to fill with water. It is necessary to purge or remove air bubbles, and purging is accomplished through air relief holes 116 in the hole ring 110 as well as air chamfer 117 around the outside bottom edge of the hole ring 110. The chamfer 117 provides an upward angled surface along which any bubbles will rise by buoyancy alone. The chamfer allows concentration of any air bubbles along a narrow edge rather than being spread out over a large, non-inclined surface. The edge tends to stretch the bubble out around the circumference where the bubble will eventually meet an air relief hole. Once part of the bubble reaches an air relief hole, the entire bubble tends to be completely displaced by water entering the bucket.

When the entire assembly is filled with water, mask/wafer separation is accomplished through spinning the assembly. Centrifugal hydrostatic pressure induced on the water surface by the rotation aids in releasing the mask as it causes the mask to deflect parabolically (see FIG. 5). The amount of deflection at a given distance form the rotational axis can be determined and is a function of the angular speed, the radius of the container, the original water level, and the material properties of the mask. The downward pressure is greater on the axis of rotation, decreasing as the radius increases. A critical radius (rc) can be found where the force is zero. The pressure is upward for any radius greater than this critical radius. The effect of deflecting the flexible mask with a rigid wafer attached is that of peeling the wafer from the mask uniformly from the outer circumference toward the center. The temperature of the water is selected to optimize dissolution of the flux residues. For a specific water soluble flux, an optimal temperature for dissolution can be determined experimentally.

Using the centrifugal hydrostatic mask separation technique as described herein, separation is complete in less than one minute. This is about ten times faster than other separation techniques.

After mask separation, the mask can be cleaned and dried by means of the inventive mask support device. While the mask is still attached to the bottom of the hole ring/mask ring assembly, the entire assembly is flipped over such that the mask is on top of the fixture. It is then placed in the cleaning machine and spun at low rpm (100–300 rpm) while heated deionized water is dispensed over the top and bottom sides, cleaning the mask. After cleaning, the entire assembly is spun at high rpm (1600 rpm) to centrifugally dry the fixture and mask. The hole ring and magnet ring are designed with angled outer edges (non-vertical) to allow for complete clearing of liquids in the course of spin drying through centrifugal force.

The dimensions, compositions and geometries set forth above are illustrative of the embodiment designed for CPD and similar wafer bumping processes as practiced at the time of the application. Many variations are contemplated by the inventors as will occur to the person of skill in the art and are considered to be taught herein although not set forth in their entirety.

What is claimed is:

1. A mask support device providing removable attachment of a ferromagnetic mask, said support comprising; first and second elements, said first element having one or more ferromagnetic shunts and a face adapted for coupling to said second element;

said second element having three or more magnetic regions and a face adapted for coupling to said first element, said magnetic regions each containing a magnet bounded at north and south ends by ferromagnetic pole members, wherein the first and second element faces adapted for coupling can be coupled in a first position such that the magnetic field of each magnet extends beyond said second element so as to attract said ferromagnetic mask with sufficient force to hold said ferromagnetic mask in said device and in a second position such that the magnetic field of each magnet is redirected through one of said shunts and does not extend beyond said second element in a direction that would attract said ferromagnetic mask with sufficient force to hold said ferromagnetic mask in said device.

2. The device of claim 1 wherein the number of shunts on the first element is at least six and the number of magnetic regions on the second element is at least six.

3. The device of claim 1 wherein each shunt on the first element has one rolling member, and each magnetic region on the second element has a pair of detents, said detents being located such that said first and second elements are in said first position when the rolling member is engaged by one of the pair of detents and the first and second elements are in said second position the said rolling member is engaged by the other of said pair of detents.

4. The device of claim 1 wherein each shunt on the first element has a pair of detents, and each magnetic region on the second element has one rolling member, said detents being located such that said first and second elements are in said first position when the rolling member is engaged by one of the pair of detents and the first and second elements are in said second position the said rolling member is engaged by the other of said pair of detents.

5. The device as in claim 1 wherein each magnet is a rare earth magnet.

6. The device of claim 5 wherein the pole pieces are nickel plated low carbon steel.

7. The device of claim 1 wherein the mask is less than about 0.020 inches thick.

8. The device as in claim 3 wherein one of said first and second elements further a guide pin and the other of said first and second elements further comprises a guide pin receiving groove for receiving said guide pin to align said first and second elements with respect to one another.

9. A support for a metal mask comprising a magnetic member for generating a magnetic field and a shunt member, the shunt member being selectively moveable between an off position in which the shunt shunts the magnetic member and causes release of the mask, and an on position in which the shunt does not shunt the magnetic member, thereby allowing the magnetic field to extend beyond the support such that the magnetic member magnetically attracts the metal mask.

10. The support device of claim 9 wherein the shunt and magnetic members are ring-shaped and wherein each ring has separated magnetic and non-magnetic regions.

* * * * *